June 17, 1969 H. H. DOUGLASS 3,451,000

TRANSISTOR PUSH-PULL OUTPUT CIRCUIT

Filed May 25, 1966

INVENTOR.
HARRY H. DOUGLASS
BY
Loui B. [signature]
ATTORNEY

United States Patent Office 3,451,000

Patented June 17, 1969

3,451,000

TRANSISTOR PUSH-PULL OUTPUT CIRCUIT

Harry H. Douglass, Greenbelt, Md., assignor, by mesne assignments, to the United States of America as represented by the Secretary of the Navy Filed May 25, 1966, Ser. No. 552,988
Int. Cl. H03f 3/26, 3/10
U.S. Cl. 330—15 1 Claim

ABSTRACT OF THE DISCLOSURE

A Class AB operable push-pull transistorized amplifier utilizing two output transistors of the same conductivity type and a driver transistor of opposite type, the output transistors being isolated in output by a diode, linearity being improved by degenerative feedback from one of the output transistors to the driver transistor, and further characterized by a capacitive feedback from the collector of the other output transistor to the base thereof to reduce tendency to oscillate at higher frequencies. A second embodiment includes an additional transistor and diode for driving the second output transistor from the first output transistor to increase the power available from the second output transistor.

Figure 1:
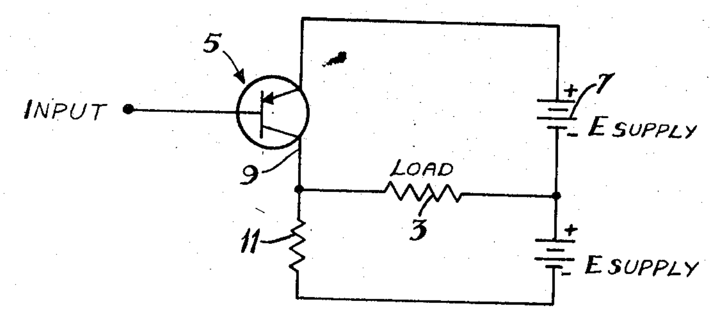

This invention relates to push-pull amplifiers, and more particularly to transistor push-pull circuits utilizing transistors of the same conductivity type.

Heretofore, one method of converting a Class A transistor amplifier to a push-pull Class AB operation required the use of a center-tapped output transformer, as described in detail in Frederick E. Terman's "Electronic and Radio Engineering," published by McGraw-Hill, New York, N.Y., Fourth Edition, 1955, pages 336–357. Similar transistor circuits are described in detail in Richard F. Shea's "Principles of Transistor Circuits," published by John Wiley and Sons Inc., New York, 1956, pages 148–156. On page 156 thereof, there is described a circuit similar to the present invention, but among other things, said circuit requires complementary transistors of opposite conductivity type. In order to provide the best operation, it is necessary in such a circuit that these complementary transistors be matched as closely as possible, which requires accurate measurements, resulting in increased cost. Applicant has provided an improved push-pull amplifier operable in the Class AB manner which utilizes transistors of the same conductivity type which thereby eliminates the resulting problems associated with circuits which utilize complementary transistors.

Accordingly, it is a prime object of this invention to provide an improved transistor push-pull amplifier which utilizes two transistors of the same conductivity type.

Another object of this invention is to provide an improved push-pull single-ended transistor amplifier which does not require the use of a center-tapped output transformer.

A still further object of the present invention is to provide an improved transistor push-pull Class AB operation amplifier which does not require the use of a driver transformer or phase-splitter stage as the input circuit.

An additional object of the present invention is to provide an improved linear amplifier of the Class AB operating type which utilizes transistors of the same conductivity type, in push-pull operation, which substantially eliminate harmonic distortion and cross-over distortion.

A still additional object of the present invention, is to provide an improved transistor push-pull output circuit, utilizing transistors of the same conductivity type, which has improved output linearity.

A further object of this invention is to provide an improved transistor push-pull output amplifier, which utilizes transistors of the same conductivity type, which is capable of handling high power outputs without danger of thermal runaway.

This invention basically comprises the addition of one transistor and one diode to a conventional Class A common emitter transistor amplifier stage, both of said transistors being of the same conductivity type. An additional feature of this invention is the utilization of negative feedback from the added transistor to the transistor utilized in the Class A common emitter stage so as to increase linearity and substantially eliminate distortion. The resulting circuitry is capable of driving much lower impedances with greater efficiency than an equivalent Class A stage. This circuit can be used either in switches or linear amplifiers and more particularly can be used to greatest advantage in a low impedance pulse amplifier and in the output stages of audio feedback amplifiers.

Figure 2:
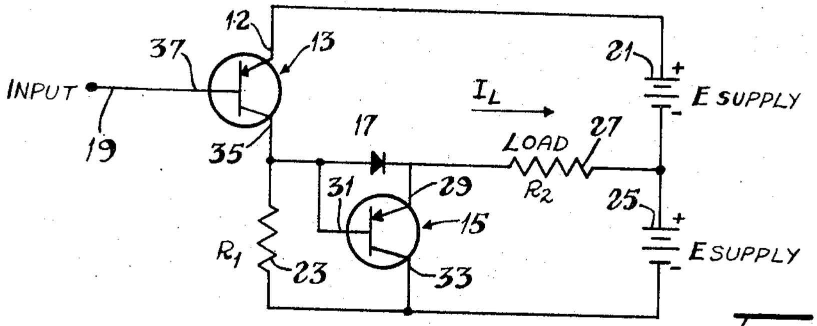
Figures 3, 4:
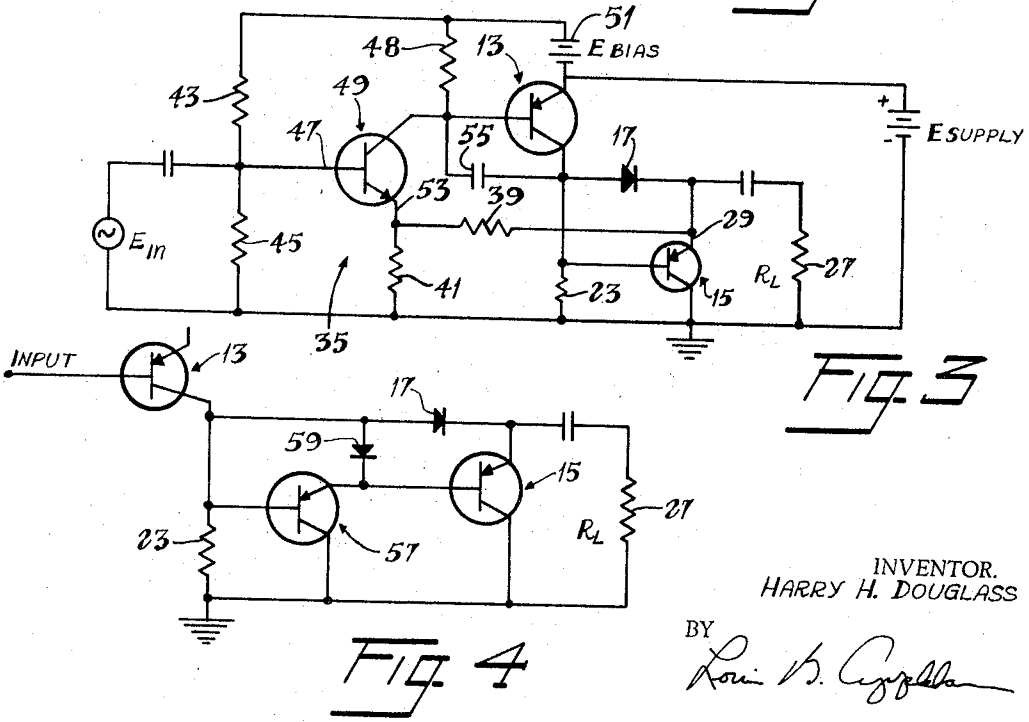

Other objects and many of the attendant advantages of this invention will be readily appreciated as the same becomes better understood by reference to the following detailed description when considered in connection with the accompanying drawings wherein:

FIG. 1 describes, in schematic form, a conventional Class A transistor amplifier;

FIG. 2 describes, in detailed schematic form, the present invention, a push-pull Class AB transistor amplifier;

FIG. 3 illustrates, in detailed schematic form, an improved push-pull, Class AB transistor amplifier embodying the invention; and FIG. 4 illustrates in detailed schematic form another feature of the present invention which can be incorporated in the circuit illustrated in FIG. 2.

Referring to FIG. 1, which describes a conventional Class A transistor amplifier, it is seen that when the output voltage across load 3, is fully positive the effective output impedance of the amplifier, specifically the saturation resistance of transistor 5, referred to as $R_s$ is low. Since the saturation resistance $R_s$ of most transistors is very low compared to a normal load resistance, maximum positive output voltage equals approximately the supply voltage 7, resulting in high efficiency. This however is not the case when the collector voltage swings in the opposite polarity, or toward cutoff. Assuming the collector 9 of transistor 5 is completely cutoff, the maximum negative voltage across load 3 is $$E_{supply}R_3/(R_{11}+R_3)$$

For maximum voltage swing the collector bias resistor 11 must be kept small compared to the load resistor 3. This condition is usually impractical due to the large power loss in resistor 11 and transistor 5 at standby. The ideal way to obtain maximum voltage swing and efficiency is to make the amplifier's impedance low in each polarity without increasing standby current, or in effect to approach Class B operation. Such a result is accomplished by the present invention.

Referring to FIG. 2, the present invention which utilizes two transistors, 13 and 15, of the same conductivity type, and operates in a push-pull manner, Class AB operation. As can be clearly seen, there has been added to the circuit of FIG. 1 a diode 17, and second transistor 15 of like conductivity type. Input signals are applied over line 19, to transistor 13, which has its emitter 12 coupled to end of the supply voltage 21. The collector of transistor 13 is then coupled to collector bias resistor 23 and the other end of collector bias resistor 23 is coupled to one end of the second supply voltage 25. A load resistor 27 is coupled to one end of the second supply voltage 21 and 25, and also at its other end to one end of diode 17, and also to the emitter of transistor 15. The other end of the diode 17 is coupled to two points, to the base 31 of transistor 15 and also to the collector 35 of transistor 13. The collector 33 of transistor 15 is coupled to the negative side of the supply voltage 25. In operation during the positive half cycles, the operation of the circuit is nearly identical to the circuit described in FIG. 1. The driving impedance is increased only by the forward impedance of diode 17, which is small. During such cycle transistor 15 is cutoff by the forward voltage drop across diode 17 caused by the load current $I_L$ flowing through transistor 13 at resistor load 27. When the load current $I_L$ swings in the opposite negative direction the output impedance is that looking into the emitter 29 of transistor 15, or approximately $R_1/h_{FE_2}$. Diode 17 blocks any load current $I_L$ flowing around transistor 15 into resistor 23. The minimum voltage across resistor 23 is then $(I_{CBO1}+I_L/h_{FE2})R_1$. Thus it is seen that the Class A state of the circuit of FIG. 1 has been converted to a low impedance driver in each direction without reducing the size of the collector bias resistor 23.

An unusual characteristic of the circuit of FIG. 2 is that its voltage gain is higher in the negative than in the positive half cycle. The open loop gain is proportional to the effective resistance seen by the collector 35, of transistor 13. In the positive swing this resistance is $R_1R_L/R_1+R_L$, while in the negative swing it is a larger value $R_1R_Lh_{FE_2}/R_1+R_Lh_{FE2}$. For pulse amplification this characteristic is of no great importance since transistor 13 is driven hard into cutoff or saturation. However, when such is utilized in a linear amplifier, the widely different gains will cause even harmonic distortion. In addition, the forward voltage drop across diode 17 will cause crossover distortion as the output voltage at load 27 begins to swing negative. To correct for these conditions, it is necessary to employ negative feedback from the output load 27 to the base 37 of transistor 13.

Referring now to FIG. 3, there is illustrated substantially the same circuit described in FIG. 2 with the addition of a driver stage 35 and negative feedback from the emitter 29 of transistor 15 to the base 37 of transistor 35 through said drive stage 35. Resistors 39 and 41 are part of the negative feedback circuit, and resistors 43 and 45 are utilized to form a voltage divider to bias the base 47 of transistor 49 of the added driver stage 35. Resistor 48 and the bias battery 51 supply collector current for transistor 49 and provides enough reverse bias to ensure the cut off of transistor 13 when the base current of transistor 49 is reduced. Resistor 39 and 41 which form the feedback network from the output 27 to the emitter 53 of transistor 49, reduces its gain and increases the output linearity of the circuit. Capacity 55 is also added so as to suppress oscillations by reducing high frequency gain. When a large amount of feedback is employed, crossover and second harmonic distortion are reduced to an extremely low value at frequencies less than the cutoff frequency of the transistors.

An important feature of the invention is its inherent thermal stability in comparison to similar conventional amplifiers. The circuit of FIG. 3 can not develop a series path through 13 and 15, since any current from the collector of 13 which passes into the emitter of 15 must first pass through diode 17. The forward voltage drop in the diode thus creates a reverse emitter to base bias across 15 which cuts off its emitter current. Both transistors may operate at their maximum specified junction temperature without danger of destruction from thermal runaway.

Referring to FIG. 4, when a larger power gain in the negative half cycle is required than that obtained with a single transistor 15, as illustrated in FIG. 3, it is necessary to employ an additional transistor 57 in cascade with transistor 15 as illustrated in FIG. 4. In this configuration, in addition to a driver transistor 57, a diode 59 is added. In the negative swing transistor 57 drives transistor 15 in an emitter coupled configuration. Diode 59 is necessary to prevent any part of the base current of transistor 15 from being shunted around transistor 57 into collector bias resistor 23. During the positive half cycle the function of diode 59 is to keep transistor 15 cutoff by supplying leakage current through a low impedance. Transistor 57 is also cutoff due to the forward voltage drop across diode 59. Thus it is seen by the utilization of two transistors in cascade an increase in power gain in the negative half cycle is achieved.

Obviously many modifications and variations of the present invention are possible in the light of the above teachings. It is therefore to be understood that within the scope of the appended claim the invention may be practiced otherwise than as specifically described.

What is claimed is:

1. A signal amplifying circuit comprising:

a driver transistor (49) having base, emitter and collector elements;

a first output transistor (13) having base, emitter and collector elements with the base element thereof connected to the collector element of said driver transistor;

a second output transistor (29) having base, emitter and collector elements with the base element thereof connected to the collector element of said first output transistor;

input means coupled to the base element of said driver transistor for applying an input signal;

output means (27) coupled to the emitter element of said second output transistor for deriving an output signal;

a source of D.C. bias potential (51) connected through a first resistor (48) to the collector element of said driver transistor and through voltage divider means (43, 45) to the base element of said driver transistor;

a second source of D.C. potential connected on one side to the emitter element of said first output transistor and on the other side to the collector of said second output transistor;

a second resistor (41) connected between the emitter element of said driver transistor and said other side of said second source of D.C. potential;

a third resistor (23) connected between the collector element of said first output transistor and said other side of said second source of D.C. potential.

a fourth resistor (39) connected between the emitter element of said second output transistor and the emitter element of said driver transistor;

unidirectional conducting means (17) connected to permit current flow from the collector element of said first output transistor to the emitter element of said second output transistor; and capacitor means (55) connected between the collector element and the base element of said first output transistor for suppressing oscillations due to high frequency gain.

References Cited

UNITED STATES PATENTS

| | | | |
|---|---|---|---|
| 2,789,164 | 4/1957 | Stanley | 330—26X |
| 3,244,996 | 4/1966 | Ott | 330—15 |

ROY LAKE, *Primary Examiner.*

LAWRENCE J. DAHL, *Assistant Examiner.*

U.S. Cl. X.R.

330—024